United States Patent
Anzai et al.

(10) Patent No.: US 7,020,037 B2
(45) Date of Patent: Mar. 28, 2006

(54) NONVOLATILE SEMICONDUCTOR MEMORY DEVICE

(75) Inventors: Shinsuke Anzai, Tenri (JP); Yasumichi Mori, Ikoma (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 11/051,139

(22) Filed: Feb. 4, 2005

(65) Prior Publication Data

US 2005/0174868 A1 Aug. 11, 2005

(30) Foreign Application Priority Data

Feb. 6, 2004 (JP) ............................. 2004-030070

(51) Int. Cl.
*G11C 7/02* (2006.01)
(52) U.S. Cl. .............. 365/210; 365/185.03; 365/185.2; 365/185.22
(58) Field of Classification Search ................ 365/210, 365/185.03, 185.2, 185.22
See application file for complete search history.

(56) References Cited

U.S. PATENT DOCUMENTS 6,115,285 A * 9/2000 Montanari et al. ..... 365/185.03

FOREIGN PATENT DOCUMENTS

| JP | 59-104796 A2 | 6/1984 |
| JP | 2002-100192 A2 | 4/2002 |

* cited by examiner

*Primary Examiner*—Richard Elms
*Assistant Examiner*—Pho M. Luu
(74) *Attorney, Agent, or Firm*—Morrison & Foerster LLP (57) ABSTRACT

A nonvolatile semiconductor memory device includes a readout circuit which reads data stored in a selected memory cell by applying predetermined voltage to the selected memory cell and a reference cell such that currents corresponding to the respective threshold voltage may flow, and comparing the current flowing in the selected memory cell with the current flowing in the reference cell. The readout circuit commonly uses the reference cell set in the same storage state for normal readout and for readout for program verification, and when the predetermined voltage is applied to the selected memory cell and the reference memory cell at the time of the readout for the program verification, it sets an applying condition to the reference memory cell such that its storage state may be shifted more in the program state direction than that in an applying condition at the time of the normal readout.

7 Claims, 9 Drawing Sheets

PRIOR ART

PRIOR ART

FIG. 9

NONVOLATILE SEMICONDUCTOR MEMORY DEVICE

CROSS REFERENCE TO RELATED APPLICATTION

This Nonprovisional application claims priority under 35 U.S.C. §119(a) on Patent Application No. 2004-030070 filed in Japan on Feb. 6, 2004, the entire contents of which are hereby incorporated by reference.

BACKGROUND OF THE INVENTION

1. Field of the Invention

The present invention relates to a nonvolatile semiconductor memory device such as a flash memory and more particularly, it relates to a constitution of a reference cell which is a reference at the time of readout, or at the time of verification for program or erase of a memory cell of the nonvolatile semiconductor memory device.

2. Description of the Related Art

Various kinds of methods are employed in order to read a storage state of a memory cell in a semiconductor memory device. A description will be made of a flash memory which is one of the nonvolatile semiconductor memory devices as one example. The flash memory is constituted such that each memory cell comprises a memory transistor having a floating gate structure and information is stored according to an amount of charges (electrons) input to the floating gate of each memory cell. More specifically, when many electrons are stored in the floating gate, an inversion layer is not likely to be formed in a channel region, so that the threshold voltage of the memory cell becomes high (which is defined as a programmed state). Meanwhile, when the electrons are discharged from the floating gate, the inversion layer is likely to be formed in the channel region and the threshold voltage of the memory cell becomes low (which is defined as an erased state). In order to determine whether the state of the selected memory cell is the programmed state or the erased state at high speed, a reference memory cell having a middle threshold voltage between the programmed state and the erased state is input to a differential input type of sense amplifier.

Figure 4:
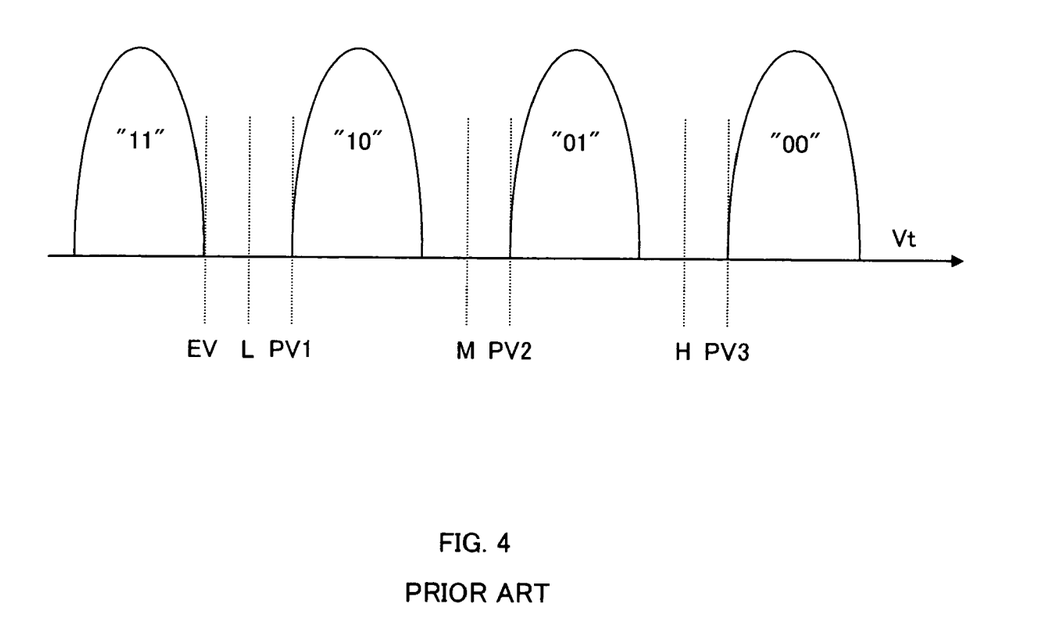
FIG. 4 is a view for explaining a relation between threshold voltage distribution characteristics of a 4-value flash memory cell and a verifying voltage.

In addition, in a case of a flash memory in which multi-level data (4-value data, for example) can be stored in each memory cell, there are four storage states shown in FIG. 4 depending on the amount of charges stored in the floating gate.

The state in which the charge quantity is smallest is "11", which corresponds to the erased state. In order to transit from "11" state to any one of storage states "10", "01", and "00", the charges are injected to the floating gate of the memory cell, which operation is called a program operation.

The program operation can be performed only in the direction in which the charges of the floating gate are increased. For example, in order to transit from the state "01" to the state "10", it is necessary to perform the erase operation once to implement the state "11" and then to perform the program operation to implement the state "10". Here, although the program operation can be performed by a memory cell, the erase operation is performed by the plural memory cells.

The general program operation of the flash memory will be described with reference to FIG. 1. When the program operation is performed on the flash memory, a program command is input through an I/O pad 22 and an address of the memory cell for the program operation is input through an address pad 1 to be specified in a first cycle. The inputted command is decoded by a command decoder 23 and when it is the program command, command decoder 23 directs a control circuit 13 to controls data (program data) inputted from the I/O pad 22 so as to be programmed in the address inputted from the address pad 1 in a second cycle.

The address of the memory cell for the program operation is decoded in a main row decoder 4 and a main column decoder 8 through an address multiplexer 3 and at the same time, the plural number (eight, for example) of flash cells are selected.

In order to raise the threshold voltage of the flash cell, channel hot electrons which are generated when the source of the memory cell transistor is set at 0 V and a high voltage is applied to its gate and drain are injected into the floating gate.

A pulse pattern generated in a program circuit 12 based on the program data determines whether the data is programmed in the selected memory cell or which storage state is implemented.

The voltage which is divided from the high voltage, for example 12 V raised by a pumping circuit 14 depending on the storage state (threshold voltage) for the programming is outputted from a digital/analog converter circuit (D2A) 16 and is applied to the gate of the memory cell through the main row decoder 4. The control signal from the control circuit 13 determines the voltage value to be outputted from the D2A 16.

A voltage, 5 V, for example is applied only to the drain of the memory cell for the program in the selected memory cell through the program circuit 12 and the main column decoder 8 for a certain period of time (program pulse). A voltage 0 V is applied to the drains of the cells which are not for the program so that the charges are not injected thereto to prevent the threshold voltage from being changed (that is, programmed).

After the program pulse is applied, it is verified whether the desired threshold voltage is attained by comparing it with the threshold voltage of the reference memory cell of a reference array 11 selected by a reference column decoder 7 and a reference row decoder 5, by the sense amplifier 9. Although the verifying operation is a kind of the readout operation, it is performed in order to secure the operation margin at the time of reading. Therefore, the operation margin is provided by setting the threshold voltage of the reference cell to be used at the time of the verification so as to be different from the threshold voltage of the reference cell to be used at the time of the reading when a wafer is tested.

The verifying operation will be described with reference to FIG. 1. Since the selection of the memory cell is the same as at the time of the programming, its description will be omitted. The verifying operation is performed by setting the source, the drain, and the gate of the memory cell at 0 V, at a low voltage (1 V, for example), at a readout voltage (6 V, for example), respectively. This voltage setting is in common with the memory cell of a main memory array 10 and the reference memory cell of the reference array 11, and the voltage which is raised by the pumping circuit 14 and divided by the D2A 16 is applied to the main memory array 10 through a main high-voltage switch circuit 17 and to the reference array 11 through a reference high-voltage switch circuit 18.

When the threshold voltage of the memory cell after the program operation is lower than the threshold voltage of the reference memory cell, a signal level "1" (showing that the programming is not completed yet), for example is sent from the sense amplifier 9 to the program circuit 12 and then the program pulse is applied again. After the pulse is applied, the verifying operation is performed again, so that the program pulse is applied until the sense amplifier 9 outputs the signal level "0" (showing that the programming is completed).

A description will be made of how a readout margin is provided by the verifying operation with reference to FIG. 4. When the data "01" is to be programmed, for example, the reference memory cell having the threshold voltage PV2 is used in the verifying operation. As described above, since the programming is performed until the threshold voltage of the memory cell exceeds the threshold voltage of the reference memory cell, the threshold voltage of the memory cell after the programming is completed is surely more than the threshold voltage PV2.

Since the data "01" is read using the reference memory cell having a threshold voltage M shown in FIG. 4, there is a threshold voltage difference of at least (PV2–M) between the memory cell for the readout and the reference memory cell (threshold voltage M). In general, as the threshold voltage difference between the two memory cells to be input to the sense amplifier is larger, the data can be read more stably at higher speed. That is, as the threshold voltage difference (PV2–M) is larger, the readout margin is increased.

Therefore, conventionally, the threshold voltage for the ordinal readout is distinguished from the threshold voltage for the verifying operation in order to provide enough readout margin, and there are prepared the plural reference memory cells which are individually set by the program state so as to correspond to the multiple-level memory (refer to JP-A 59-104796 and JP-A 2002-100192, for example).

Figure 8:
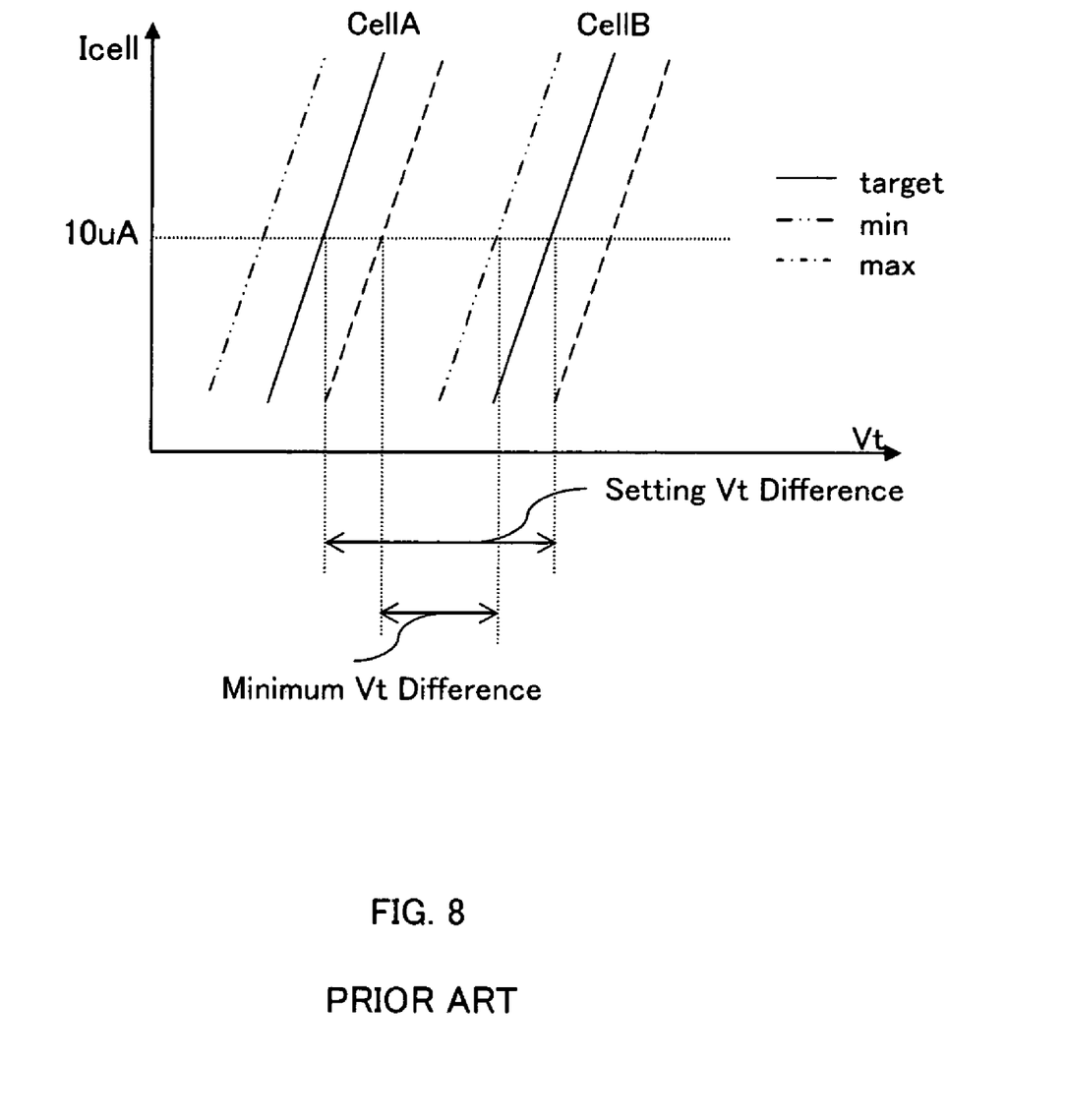
FIG. 8 is a view for explaining problems in setting (trimming) a threshold voltage of the conventional flash memory.

Although the threshold voltage of each reference memory cell is set using a tester at the time of a test, when the threshold voltage setting of the reference memory cell (Cell A) for the readout and the reference memory cell (Cell B) for the verification are shifted by the error of the tester as shown in FIG. 8, it is considered that the provided threshold voltage difference could be smaller than the set threshold voltage difference. More specifically, when the threshold voltage of the reference memory cell for the verification is shifted in the negative direction and the threshold voltage of the reference memory cell for the readout is shifted in the positive direction, the threshold voltage difference becomes smaller than the set value. If such shifts occur, there is a problem such that the operation margin at the time of the readout becomes small.

Since the nonvolatile semiconductor memory device meets demands for high capacity, the memory cell tends to become a multi-level cell and it is necessary to provide the reference memory cells having the many kinds of threshold voltages in order to determine many storage levels. That is, the number of the reference memory cells and level sense circuits incidental to them are increased.

In addition, the following problems are generated when the threshold voltage of the reference memory cell is set (referred to as "trimming") at the time of the test in the conventional nonvolatile semiconductor memory device. That is, since the number of the reference memory cells of the nonvolatile semiconductor memory device is increased because of an increase in capacity, multi-level memory and the like, the number of the reference memory cells to be trimmed is increased. In addition, although high precision of the trimming of the reference memory cell is required because of the multi-level cells, as the number of the reference cells is increased and as the trimming step becomes finer to provide higher precision, the trimming time is more increased; this causes production efficiency to be lowered.

SUMMARY OF THE INVENTION

The present invention was made in view of the above problems and it is an object of the present invention to provide a semiconductor memory device in which the problems regarding the trimming of the reference memory cell are solved and multi-level cells can be handled and a readout operation can be performed stably at high speed.

A nonvolatile semiconductor memory device according to the present invention to attain the above object is characterized by first characteristics in that it comprises a main memory array comprising a plurality of arranged memory cells having a nonvolatile memory element, at least one reference memory cell having the nonvolatile memory element, an address selection circuit which selects a particular memory cell from the main memory array, a readout circuit which reads data stored in the memory cell selected by the address selection circuit, by applying a predetermined electric stress to the selected memory cell and the reference memory cell so that currents corresponding to the respective storage states may flow, and comparing the current flowing in the selected memory cell with the current flowing in the reference memory cell, and a program circuit which programs data in the memory cell selected by the address selection circuit, and the readout circuit commonly uses the reference memory cell set in the same storage state at the time of normal readout and at the time of readout for program verification, and sets an applying condition to the reference memory cell such that its storage state may be shifted more in the program state direction than that in an applying condition at the time of the normal readout when the predetermined electric stress is applied to the programmed memory cell and the reference memory cell at the time of the readout for the program verification.

More specifically, according to the nonvolatile semiconductor memory device of the first characteristics, the nonvolatile memory element is a nonvolatile memory transistor having an FET structure in which a threshold voltage is changed depending on a storage state, and the readout circuit applies a voltage at the same level to a gate of the nonvolatile memory transistor of each of the selected memory cell and the reference memory cell at the time of the normal readout, and applies a voltage at a different level to the gate of the nonvolatile memory transistor of each of the programmed memory cell and the reference memory cell at the time of the readout for the program verification. Furthermore, according to the nonvolatile semiconductor memory device of the present invention is so constituted that a threshold voltage of the nonvolatile memory transistor of the reference memory cell can be adjusted at the time of a test.

According to the nonvolatile semiconductor memory device comprising the first characteristics of the present invention, since the readout circuit commonly uses the reference memory cell set in the same storage state at the time of the normal readout and at the time of the readout for the program verification (at the time of the verification), the number of the reference memory cells can be reduced. In addition, since the substantial threshold voltage difference between at the time of the normal readout and at the time of the verification is implemented by a difference of the electric stresses applied to the reference memory cell at the time of the verification, the error at the time of setting the threshold voltage of the reference memory cell appears equally at the time of the normal readout and at the time of the verification, so that the threshold voltage difference being narrowed by the error at the time of setting the threshold voltage and readout margin being lowered do not occur. As a result, a nonvolatile semiconductor memory device which can deal with the multi-level cells and perform the readout operation stably at high speed can be provided.

The nonvolatile semiconductor memory device according to the present invention is characterized by second characteristics in that each voltage applied to the gate of the nonvolatile memory transistor of the programmed memory cell or the reference memory cell is generated by dividing the same internal voltage.

In addition to the second characteristics, the nonvolatile semiconductor memory device according to the present invention is characterized in that a circuit which generates the internal voltage has the nonvolatile memory transistor, and a voltage level of the internal voltage can be adjusted by adjusting the threshold voltage of the nonvolatile memory transistor, and furthermore it is characterized in that the threshold voltage of the nonvolatile memory transistor of the circuit which generates the internal voltage is so constituted that it can be adjusted at the time of a test.

Furthermore, according to the nonvolatile semiconductor memory device comprising the second characteristics of the present invention, the variation in voltage level applied to the gate of the nonvolatile memory transistor of each of the programmed memory cell and the reference memory cell at the time of the program verification appears in the same direction because it is based on the same internal voltage. Therefore, the variation in the threshold voltage because of the voltage variation in the gate of the reference memory cell is offset by the similar variation in the threshold voltage of the programmed memory cell; it is ensured that the threshold voltage of the programmed memory cell can be accurately compared with that of the reference memory cell. In addition, since the internal voltage level can be adjusted by the threshold voltage of the nonvolatile memory transistor, the variation in internal voltage level because of the manufacturing fluctuation can be compensated and the threshold voltage difference can be provided with high precision in many reference memory cells commonly by less number of adjustments.

In addition to any one of the above characteristics, the nonvolatile semiconductor memory device according to the present invention is characterized by third characteristics in that the memory cell can store 3-value data or more, and the plural numbers of the reference memory cells are provided for one selected memory cell so as to correspond to the storage states of 3 values or more.

According to the nonvolatile semiconductor memory device comprising the third characteristics of the present invention, the working effects of the nonvolatile semiconductor memory device comprising the first and second characteristics can be applied to the multi-level memory and there can be provided a nonvolatile semiconductor memory device having the multi-level memory, in which a readout operation can be performed stably at high speed.

DESCRIPTION OF PREFERRED EMBODIMENTS

A nonvolatile semiconductor memory device according to one embodiment of the present invention (referred to as the "device of the present invention" occasionally hereinafter) will be described with reference to the accompanying drawings.

Figure 1:
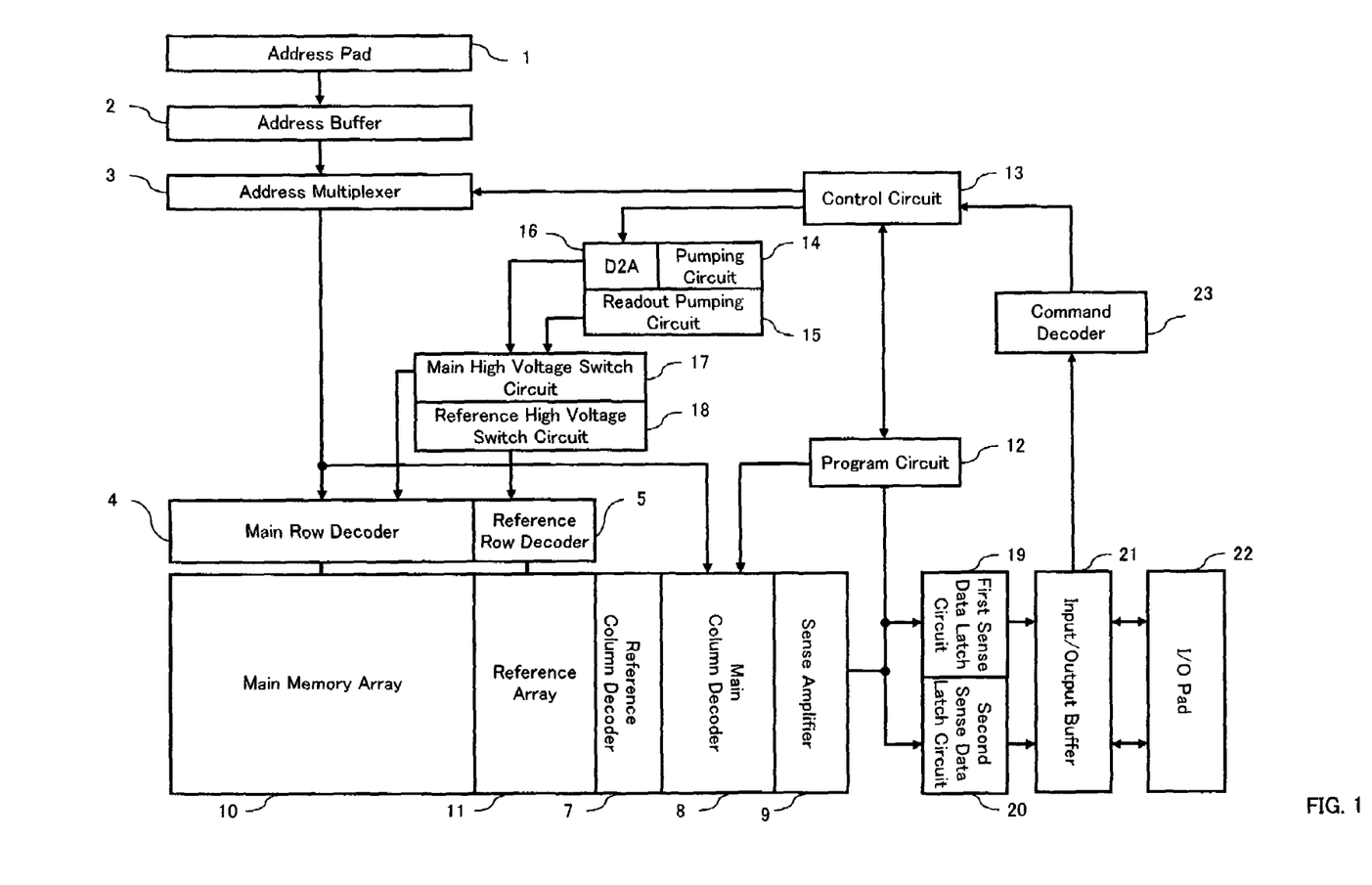
FIG. 1 is a block diagram showing a schematic constitution of a nonvolatile semiconductor memory device according to one embodiment of the present invention or a conventional flash memory.

According to the device of the present invention, its functional block in the entire device is the same as that of a conventional flash memory in general, which is shown in FIG. 1.

Referring to FIG. 1, the device of the present invention comprises an address pad 1, an address buffer 2, an address multiplexer 3, a main row decoder 4, a reference row decoder 5, a reference column decoder 7, a main column decoder 8, a sense amplifier 9, a main memory array 10, a reference array 11, a program circuit 12, a control circuit 13, a pumping circuit 14, a readout pumping circuit 15, a digital/analog converter circuit (D2A) 16, a main high-voltage switch circuit 17, a reference high-voltage switch circuit 18, a first sense data latch circuit 19, a second sense data latch circuit 20, an input/output buffer 21, an I/O pad 22, a command decoder 23, and the like. In addition, necessary control signals such as a light enable signal, a chip enable signal, an output enable signal and the like (not shown) are supplied to corresponding parts through respective input pads and input buffers.

The main memory array 10 comprises memory cells having nonvolatile memory elements and arranged in the row direction and the column direction in the form of an array, and the reference array 11 comprises reference memory cells having the same nonvolatile memory elements as the above and arranged similarly. According to this embodiment, it is assumed that each memory cell in the main memory array 10 and the reference array 11 is constituted as flash memory cell comprising a flash memory transistor having a floating gate type of FET structure as a nonvolatile memory element. Therefore, the storage state of the memory cell is set by an amount of electrons stored in the floating gate and its storage state appears as a difference between threshold voltages of the memory transistor.

Each functional block will be described in brief hereinafter. The address pad 1 is a terminal for inputting an address signal from the outside, and the address buffer 2 buffers the address signal from the address pad 1 and converts it to an internal signal level. The address multiplexer 3 has a function of switching the address signal from the outside to the internal address signal to be used in the internal circuits in various kinds of operation modes and supplies the switched address signal to various kinds of decoders.

The main row decoder 4 selects the memory cells along the row direction in the main memory array 10, the reference row decoder 5 selects the reference memory cells along the row direction in the reference array 11. In addition, the main column decoder 8 selects the memory cells along the column direction in the main memory array 10, the reference column decoder 7 selects the reference memory cells along the column direction in the reference array 11. Each decoder applies a predetermined voltage to each part (a gate, a drain and the like) of the memory cell in the main memory array 10 and the reference memory cell in the reference array 11 in each operation mode (reading, programming and erasing). Therefore, it functions as a part of a readout circuit in a normal readout operation, a program verifying operation and an erase verifying operation.

The sense amplifier 9 compares a threshold voltage of the memory cell in the main memory array 10, which is selected by the main row decoder 4 and the main column decoder 8 with a threshold voltage of the reference memory cell in the reference array 11, which is selected by the reference row decoder 5 and the reference column decoder 7 to read data programmed in the selected memory cell, and this comprises a well-known circuit. More specifically, the sense amplifier 9 applies the same bias voltage to each gate, source, and drain of both selected memory cell and the reference memory cell, compares the threshold voltage of the selected memory cell with the threshold voltage of the reference memory cell, converts a difference in drain current because of the difference in threshold voltage to a voltage difference, and amplifies the voltage difference. In addition, the sense amplifier 9 is used as a readout circuit at the time of the normal readout and also used as the readout circuit at the time of the program verification and the erase verification in this embodiment.

The program circuit 12 is a circuit for programming data corresponding to program data inputted through the I/O pad 22 in the selected memory cell, which comprises a conventional circuit constitution.

The control circuit 13 carries out a program process and an erase process by applying a program pulse and an erase pulse at the time of the program operation and the erase operation, and a verify process to verify a programmed state and an erased state by a predetermined algorithm. More specifically, it comprises a circuit constitution such as a state machine and the like. Therefore, the control circuit 13 functions as a part of a program verification circuit or an erase verification circuit.

The pumping circuits 14 internally generates a high voltage which is required for the program and erase operations from a power supply voltage supplied from the outside. In addition, the readout pumping circuit 15 generates an internal power supply voltage which is required for the readout operation from the power supply voltage supplied from the outside. They are needed to lower the power supply voltage and stabilize the internal power supply voltage. The digital/analog converter circuit (D2A) 16 drops the internal high voltage generated in the pumping circuit 14 to a voltage level depending on a control signal from the control circuit 13.

The main high-voltage switch circuit 17 is a voltage selection circuit which selects an appropriate voltage from the voltage supplied from the D2A 16 or the readout pumping circuit 15 so as to correspond to the various kinds of memory operations and supplies it to the main memory array 10. The reference high-voltage switch circuit 18 is a voltage selection circuit which selects an appropriate voltage from the voltage supplied from the D2A 16 or the readout pumping circuit 15 so as to correspond to the various kinds of memory operations and supplies it to the reference array.

The first sense data latch circuit 19 and the second sense data latch circuit 20 temporally store plural bits of data which was read by the sense amplifier 9. When a data width is large, it is divided into two and can be serially outputted.

The input/output buffer 21 receives the outputs of the first sense data latch circuit 19 and the second sense data latch circuit 20 and outputs them to the outside through the I/O pad 22 at a predetermined output level, and receives the programmed data or another command from the outside through the I/O pad 22. The I/O pad 22 is a terminal for inputting and outputting data with the outside.

The command decoder 23 decodes a command inputted through the input/output buffer 21 and outputs it to the control circuit. Here, although a class of commands which is used in a general flash memory is assumed, the command is not limited to a particular class of commands.

Figure 2:
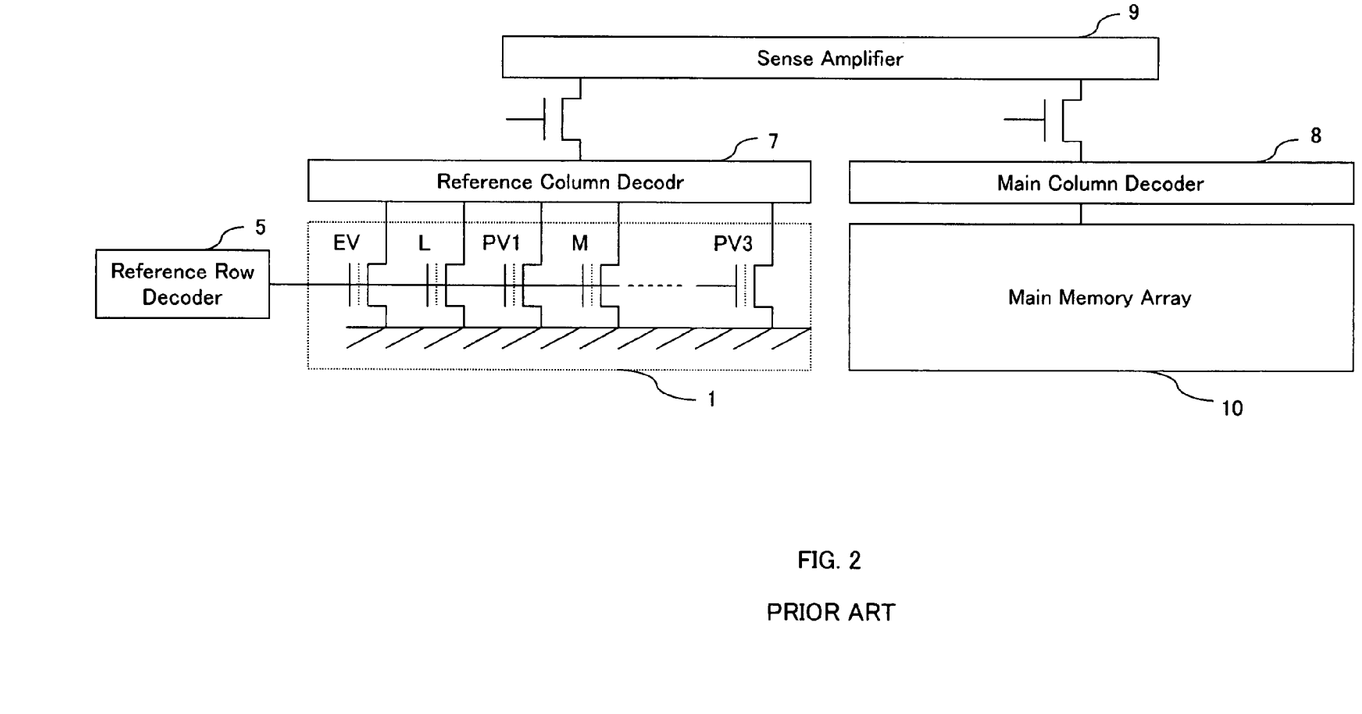
FIG. 2 is a block diagram schematically showing a relation between a constitution of a reference array of the conventional flash memory and peripheral circuits.
Figure 3:
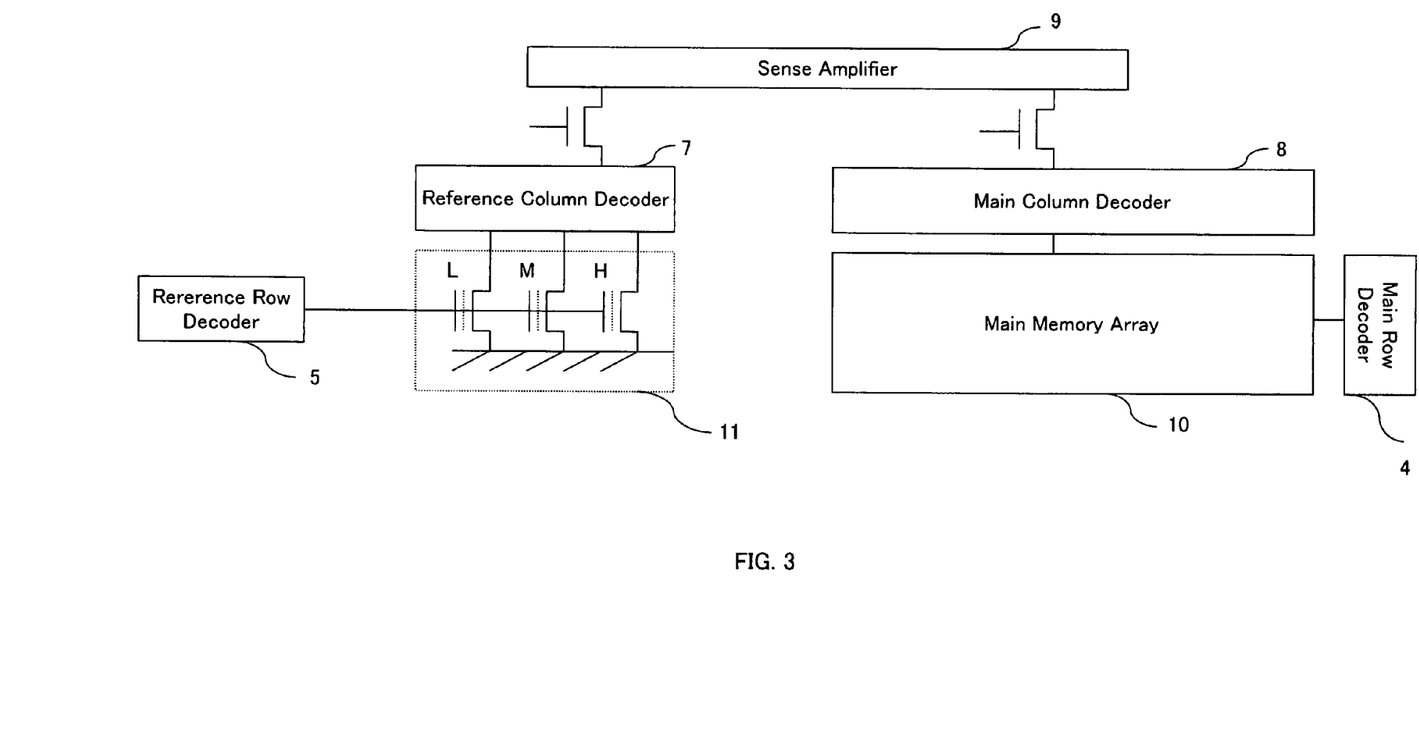
FIG. 3 is a block diagram schematically showing a relation between a constitution of a reference array and peripheral circuits according to one embodiment of the nonvolatile semiconductor memory device of the present invention.
Figure 5:
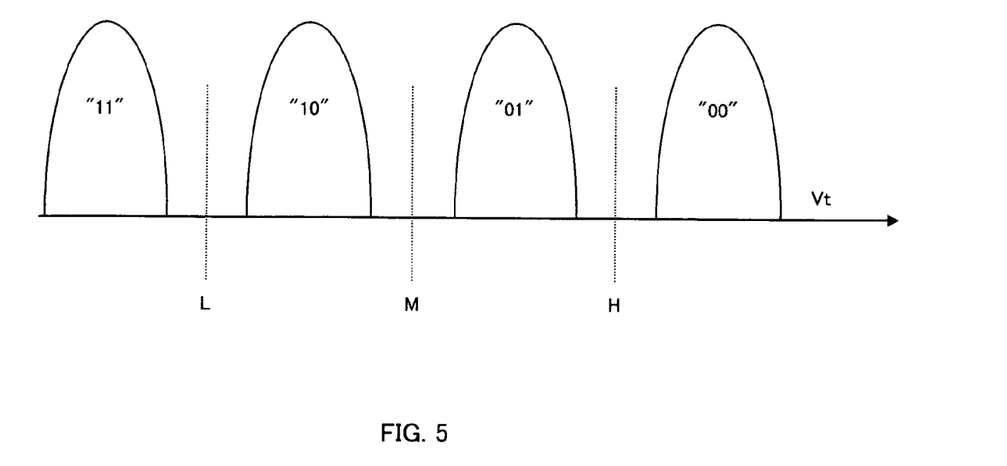
FIG. 5 is a view for explaining a relation between threshold voltage distribution characteristics of a 4-value flash memory cell and a verifying voltage in the nonvolatile semiconductor memory device according to the present invention.

Next, a constitution of the reference array 11 which is characteristic of this device of the present invention will be described with reference to FIGS. 2 to 5. First, FIG. 2 is a view schematically showing a relation between a conventional reference array 11 and its peripheral circuits, and FIG. 4 shows kinds of reference memory cells contained in the conventional reference array 11. On the other hand, FIG. 3 is a view schematically showing a relation between the reference array 11 of the present invention and its peripheral circuits, and FIG. 5 shows kinds of reference memory cells contained in the reference array 11 of the device of the present invention.

When it is assumed that each memory cell is four-value memory which stores four-value data, at least seven kinds of reference memory cells are prepared in the conventional example. That is, three kinds of threshold voltages L, M and H are prepared for the normal readout. The threshold voltages L, M and H are set at a middle value between an upper limit value of threshold voltage distribution in "11" state (erased state) and a lower limit value of threshold voltage distribution in "10" state, a middle value between an upper limit value of the threshold voltage distribution in the "10" state and a lower limit value of threshold voltage distribution in "01" state, and a middle value between an upper limit value of the threshold voltage distribution in the "01" state and a lower limit value of threshold voltage distribution in "00" state, respectively. In addition, according to the conventional reference memory cell, there are prepared three kinds of threshold voltages such as PV1, PV2 and PV3 for program verification. The threshold voltages PV1, PV2 and PV3 are set at the lower limit value of the threshold voltage distribution in the "10" state, at the lower limit value of the threshold voltage distribution in the "01" state, and at the lower limit value of the threshold voltage distribution in the "00" state, respectively. Furthermore, there is prepared one kind of threshold voltage EV for erase verification in the conventional reference memory cell. The threshold voltage EV is set at the upper limit value of the threshold voltage distribution in the "11" state (erased state).

Meanwhile, according to the reference array 11 of the present invention, only three kinds of threshold voltages L, M and H for the normal readout are provided and the reference memory cell for the verification is omitted.

Since the conventional flash memory and the device of the present invention use the same reference memory cells at the time of the normal readout, their operation procedures are the same, so that its detailed description will be omitted.

A description will be made of procedures in reading the data using the reference memory cells having threshold voltages of L, M and H for the normal readout at the time of the program verification. First, when application of the program pulse is completed, the reference memory cell corresponding to the program data is selected by the reference column decoder 7 and the reference row decoder 5. For example, when the data "01" is programmed, the reference memory cell having the threshold voltage M is selected while the memory cell to which the data is programmed is selected by the main row decoder 4 and the main column decoder 8. Since the plurality of memory cells are processed at the same time in the program process normally, when their verifications are performed at the same time, the same number of sense amplifiers 9 and the same number of reference memory cells are used. However, the following description will be made for one memory cell.

Figure 6:
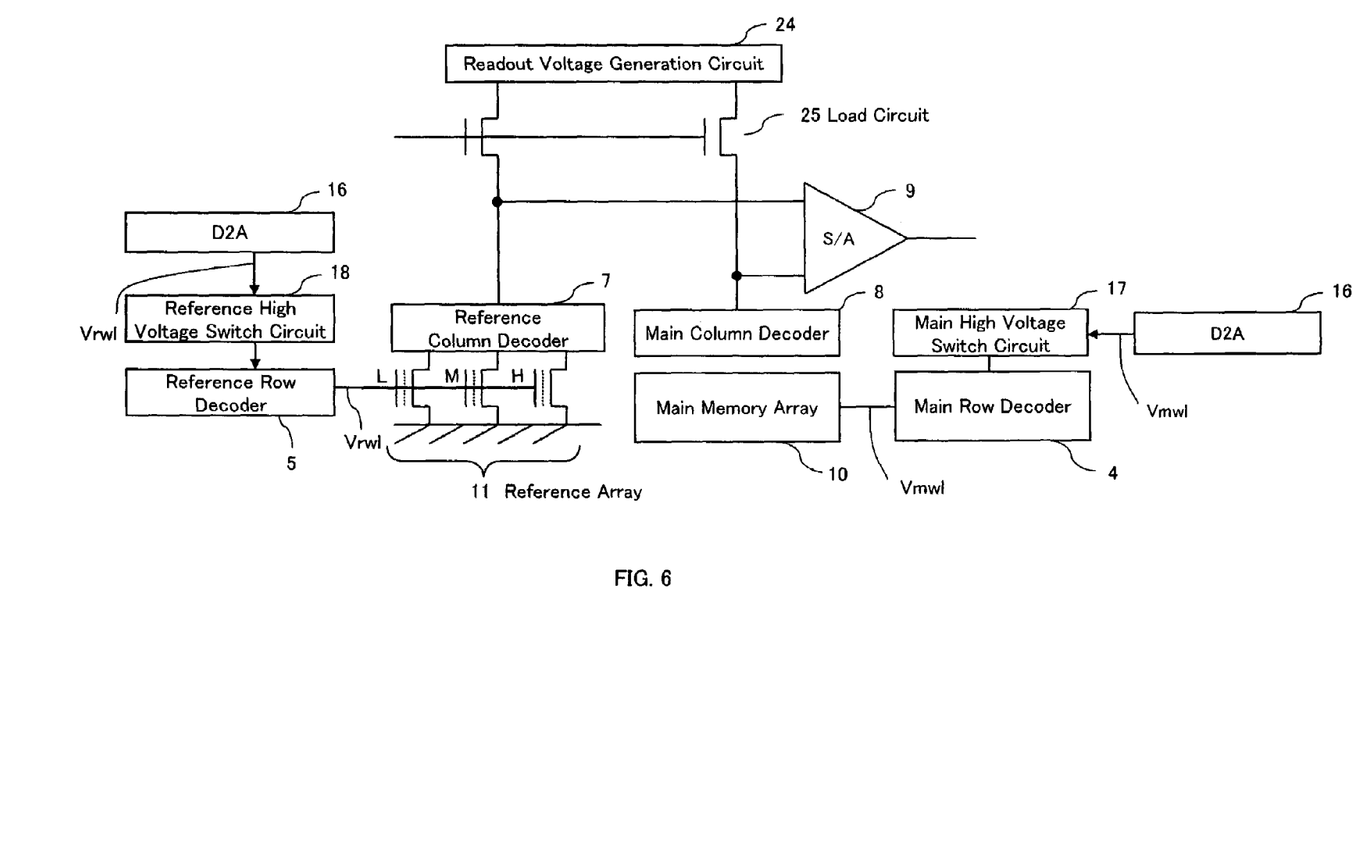
FIG. 6 is a block diagram schematically showing a main circuit regarding a reading operation or a verifying operation in one embodiment of the nonvolatile semiconductor memory device according to the present invention.
Figure 7:
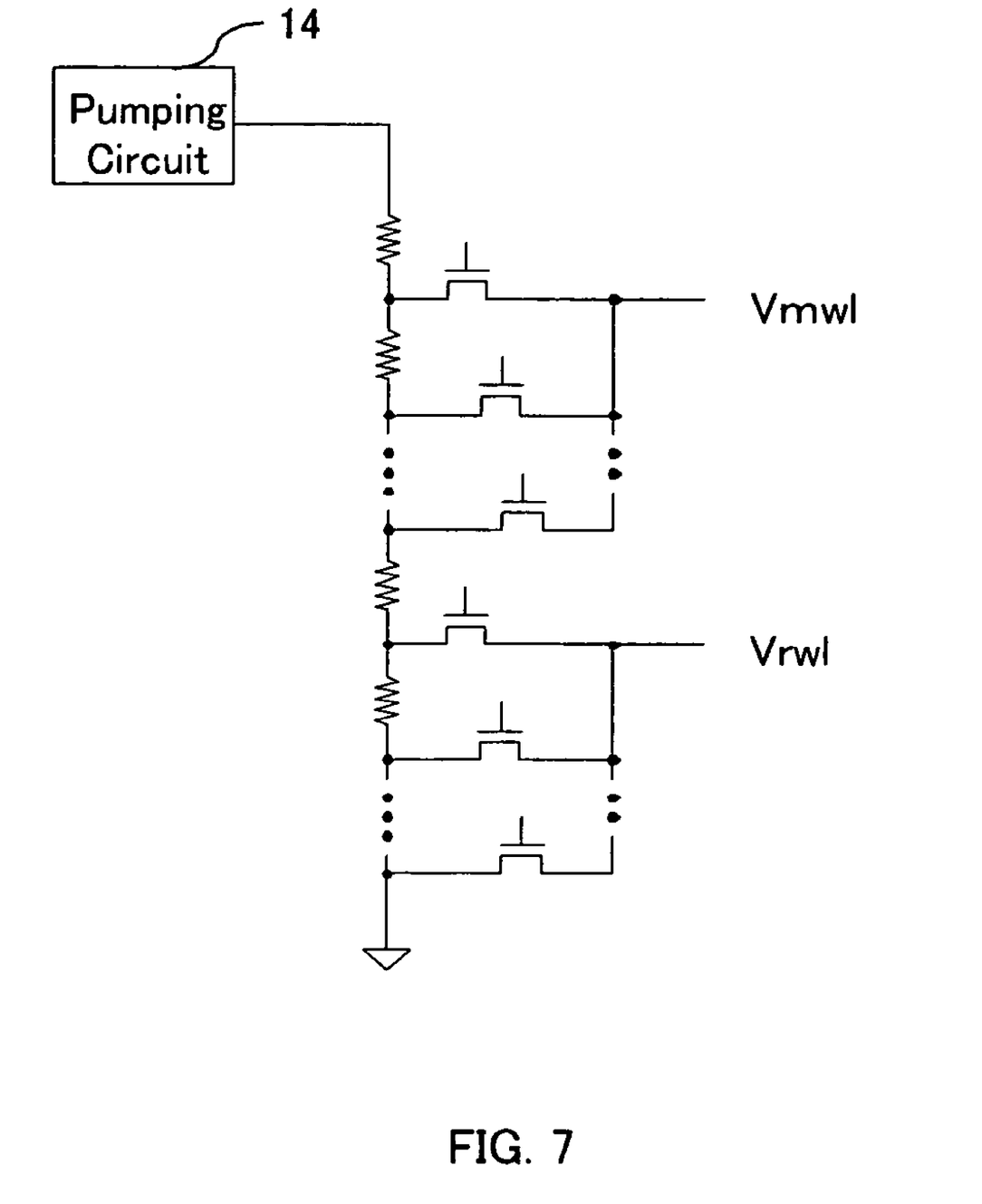
FIG. 7 is a circuit diagram showing a schematic circuit which generates a main gate voltage applied to a gate of a selected memory cell and a reference gate voltage applied to a gate of a reference memory cell in one embodiment of the nonvolatile semiconductor memory device according to the present invention.

As shown in FIG. 6, when the memory cell for the program and the reference memory cell having the threshold voltage M are selected, a main gate voltage Vmw1 is applied to a gate of the selected memory cell through the main row decoder 4, and a reference gate voltage Vrw1 is applied to a gate of the reference memory cell through the reference row decoder 5. As shown in FIG. 7, each of the gate voltages Vmw1 and Vrw1 is generated by supplying the internal voltage (high voltage) generated in the pumping circuit 14 to the D2A 16 and dividing the internal voltage by a divider circuit comprising a resistance ladder circuit. The voltages of 10 mV intervals divided by the ladder resistance, for example, can be selected by the selection signal from the control circuit 13. Here, the main gate voltage Vmw1 is set higher than the reference gate voltage Vrw1 by a threshold voltage difference (PV2−M). Since each of drain currents flowing in the selected memory cell and the reference memory cell is determined by the difference between the gate voltage and the threshold voltage, when the reference gate voltage Vrw1 is lower by the threshold voltage difference (PV2−M), if it is assumed that the reference gate voltage Vrw1 is raised so as to be the same voltage as the main gate voltage Vmw1, the threshold voltage of the reference memory cell becomes apparently high and equivalent to PV2. Thus, when the threshold voltage of the selected memory cell is less than PV2, the output of the sense amplifier 9 is "1" at the time of the program verification, which is determined that the program process is not completed. Thus, the program pulse is continued to be applied until the threshold voltage of the selected memory cell becomes PV2 or more and the output of the sense amplifier 9 becomes "0".

Next, an operation of the sense amplifier 9 will be described in brief. As shown in FIG. 7, the drain currents flowing in the selected memory cell and the reference memory cell are supplied from the readout voltage generation circuit 24 when a predetermined readout voltage generated by the readout generation circuit 24 is lowered to a predetermined bias voltage by a load circuit 25 comprising an N-channel MOSFET, for example, and applied to the drain of the memory cell through the main column decoder 8 and the reference column decoder 7 and the like. In addition, since each drain current supplied from the readout voltage generation circuit 24 is converted to a voltage by the load circuit 25, the difference between drain currents because of the threshold voltage difference of memory cells is converted to a voltage difference between input nodes of the sense amplifier 9. Thus, the selected memory cell can be compared with the reference memory cell by the voltage differential input type of sense amplifier.

As described above, according to the device of the present invention, the threshold voltage distribution of the memory cell for programming can be controlled like in the conventional example by adjusting the reference gate voltage Vrw1 without providing the reference memory cell for program verification. In addition, as will be described below, an operation margin is improved as compared with the conventional example.

Figure 9:
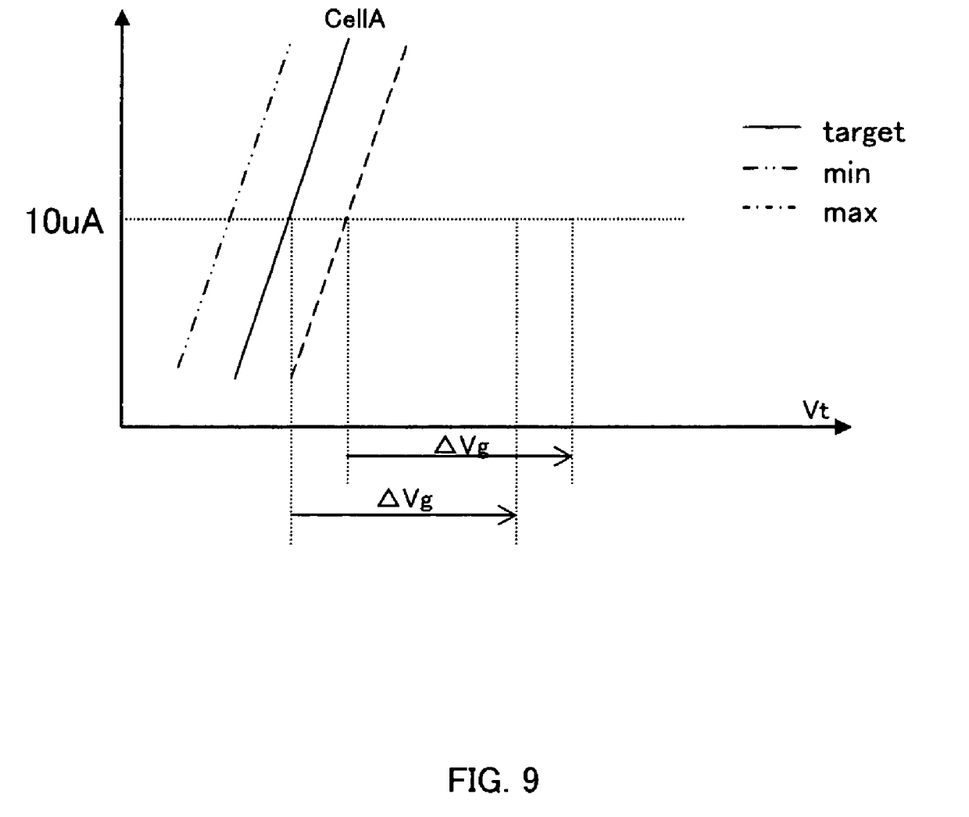
FIG. 9 is a view for explaining advantages in setting (trimming) the threshold voltage in the nonvolatile semiconductor memory device according to the present invention.

Next, a brief description will be made of the reason why the readout operation margin is improved in the device of the present invention. As described above, if the reference memory cell for the program verification is used like in the conventional example, when threshold voltage setting directions of the reference memory cell (Cell A) for the readout and the reference memory cell (Cell B) for the verification become opposite to each other, the threshold voltage difference becomes narrow and the readout operation margin is lowered, as shown in FIG. 8. According to the device of the present invention, when the reference gate voltage Vrw1 of the reference memory cell (Cell A) for the readout is only adjusted without using the reference memory cell for the program verification, an error of the threshold voltage of the reference memory cell (Cell A) for the readout appears as an error of the substantial threshold voltage of the reference memory cell in the same direction at the time of the verification as it is as shown in FIG. 9. As a result, since the threshold voltage is relatively high at the time of the program verification, even if the threshold voltage of the selected memory cell for the program becomes relatively high, the threshold voltage of the reference memory cell for the normal readout is also shifted to be relatively high, so that the threshold voltage difference between the selected memory cell and the reference memory cell can be maintained. As a result, the readout operation margin is prevented from being lowered because of the threshold voltage setting error of the reference memory cell for the normal readout, so that the readout operation margin is improved as compared with the conventional example.

Next, a description will be made of procedures when the readout is performed using the reference memory cell having the threshold voltage L for the normal readout at the time of erase verification. First, when application of the erase pulse is completed, the reference memory cell of the threshold voltage L is selected by the reference column decoder 7 and the reference row decoder 5. Meanwhile, the memory cell for the erase is selected from erase blocks in the main memory array 10 by the main row decoder 4 and the main column decoder 8 based on an internal address generated in the control circuit 13. Since the memory cell for the erase is erased by the block normally, the verification is performed by the several bits at the same time depending on the number of the sense amplifiers 9. The following description will be made for one selected memory cell.

When the selected memory cell for the erase and the reference memory cell having the threshold voltage L are selected, the main gate voltage Vmw1 is applied to the gate of the selected memory cell through the main row decoder 4, and a reference gate voltage Vrwle is applied to the gate of the reference memory cell through the reference row decoder 5. While the main gate voltage Vmw1 is set higher than the reference gate voltage Vrw1 by the threshold voltage difference (PV2−M), for example at the time of the program verification, the main gate voltage Vmw1 is set lower than the reference gate voltage Vrwle by a threshold voltage difference (L−EV) at the time of the erase verification. This is because the threshold voltage EV of the reference memory cell for the erase verification is set lower than the threshold voltage L of the reference memory cell for the readout of the data "10" in order to ensure the readout margin. Similar to the program verification, the main gate voltage Vmw1 and the reference gate voltage Vrwle are generated by supplying the internal voltage (high voltage) generated in the pumping circuit 14 to the D2A 16 and dividing the interval voltage by a divider circuit comprising the resistance ladder circuit.

The plural numbers of the reference memory cells having threshold voltages L, M and H for the normal readout are provided depending on constitutions of the main memory array 10 and the reference array 11, a data width, the presence of dual-work function in which while the normal readout operation is performed in a certain memory array block, the program or erase operation can be performed in another memory array block, and their threshold voltages are adjusted (trimmed) by a tester at the time of a test. Therefore, the erase and program operations for the reference memory cell of the reference array 11 can be performed with the circuit for the test. Since the trimming is the same as that for the reference memory cell for the ordinary readout in the conventional flash memory, its description will be omitted.

Next, another embodiment of the device of the present invention will be described.

(1) Although the reference memory cell for the ordinal readout is used also at the time of the erase verification in the above embodiment, a reference memory cell only for erase verification may be used at the time of the erase verification. Just omitting the reference memory cell for the program verification can reduce the number of the reference memory cells and the readout margins of the data "10", "01", and "00" can be improved and the effect of the present invention is provided.

(2) The block constitution illustrated in FIG. 1 in the above embodiment is only one example and the present invention is not limited to the constitution in FIG. 1. In addition, although the present invention has been described using the case of the four-value memory, the number of storage states per memory cell is not limited to four.

(3) Although three kinds of the reference memory cells for the normal readout are prepared in the case of the four-value memory in the above embodiment, only one kind of the reference memory cell having the threshold voltage M may be prepared and the threshold voltages L and H of the reference memory cells may be generated depending on the changes in the reference gate voltage Vrw1.

(4) It is preferable in the above embodiment that the pumping circuit 14 has the flash memory transistor and the voltage level of the internal voltage supplied to the D2A 16 can be adjusted by adjusting the threshold voltage of the flash memory transistor. For example, the internal voltage supplied to the D2A 16 can be stabilized by constituting such that two flash memory transistors are prepared and the output voltage is regulated using the threshold voltage difference between the two flash memory transistors as a reference voltage.

(5) Although the flash memory cell is assumed as the memory cell in the above embodiment, the memory cell is not limited to the flash memory cell. In addition, the same concept can be applied to a variable resistive element type of memory cell such as MRAM, OUM, RRAM and the like other than the memory cell in which the difference in storage state appears as the difference between threshold voltages of the memory transistor.

As described above, according to the nonvolatile semiconductor memory device of the present invention, since one reference memory cell can function as the reference memory cells comprising the plural kinds of the threshold voltages, one reference memory cell can be used for the readout and the verification. In addition, one reference memory cell can function as the plural kinds of the reference memory cells for the readout comprising the plural kinds of threshold voltages for the readout. Furthermore, one reference memory cell can function as the plural kinds of the reference memory cells for the verification comprising the plural kinds of verifying voltages.

When one reference memory cell functions as the plural kinds of reference memory cells for the readout or the verification, the number of reference memory cells can be reduced. In addition, since the number of the reference memory cells can be reduced, the number of reference memory cells for the verification is reduced and the labor in the verifying step can be saved. In addition, an overhead of a layout area for the sense amplifier for reading the storage data in the selected memory cell and the reference memory cell can be reduced. Furthermore, since the threshold voltage is controlled by the gate input voltage of the reference memory cell, margin voltages of the verifying voltage at the time of readout and the verifying voltage at the time of program or erase can be surely provided, and the operation of the nonvolatile semiconductor memory device can be stabilized, and speeded up, and reliability thereof can be increased. In addition, since the number of the reference memory cells is reduced and the threshold voltage of the reference memory cell can be controlled by the gate voltage, the threshold voltage of the reference memory cell can be trimmed with high precision without lowering the production efficiency.

Although the present invention has been described in terms of the preferred embodiments, it will be appreciated that various modifications and alterations might be made by those skilled in the art without departing from the spirit and scope of the invention. The invention should therefore be measured in terms of the claims which follow.

What is claimed is:

1. A nonvolatile semiconductor memory device comprising:

a main memory array comprising a plurality of arranged memory cells each having a nonvolatile memory element;

at least one reference memory cell having the nonvolatile memory element;

an address selection circuit which selects a particular memory cell from the main memory array;

a readout circuit which reads data stored in the memory cell selected by the address selection circuit, by applying a predetermined electric stress to the selected memory cell and the reference memory cell so that currents corresponding to the respective storage states may flow, and comparing the current flowing in the selected memory cell with the current flowing in the reference memory cell; and a program circuit which programs data in the memory cell selected by the address selection circuit, wherein the readout circuit commonly uses the reference memory cell set in the same storage states at the time of normal readout and at the time of readout for program verification, and when the predetermined electric stress is applied to the programmed memory cell and the reference memory cell at the time of the readout for the program verification, the readout circuit sets an applying condition to the reference memory cell such that its storage state may be shifted more in the program state direction than that in an applying condition at the time of the normal readout.

2. The nonvolatile semiconductor memory device according to claim 1, wherein the nonvolatile memory element is a nonvolatile memory transistor having an FET structure in which a threshold voltage is changed depending on a storage state, and the readout circuit applies a voltage at the same level to a gate of each nonvolatile memory transistor of the selected memory cell and the reference memory cell at the time of the normal readout, and applies a voltage at a different level to the gate of each nonvolatile memory transistor of the programmed memory cell and the reference memory cell at the time of the readout for the program verification.

3. The nonvolatile semiconductor memory device according to claim 2, wherein a threshold voltage of the nonvolatile memory transistor of the reference memory cell can be adjusted at the time of a test.

4. The nonvolatile semiconductor memory device according to claim 2, wherein each voltage applied to the gate of the nonvolatile memory transistor of the programmed memory cell or the reference memory cell is generated by dividing same internal voltage.

5. The nonvolatile semiconductor memory device according to claim 4, wherein a circuit which generates the internal voltage has the nonvolatile memory transistor, and a voltage level of the internal voltage can be adjusted by adjusting a threshold voltage of the nonvolatile memory transistor.

6. The nonvolatile semiconductor memory device according to claim 5, wherein a threshold voltage of the nonvolatile memory transistor of the circuit which generates the internal voltage can be adjusted at the time of a test.

7. The nonvolatile semiconductor memory device according to claim 1, wherein the memory cell can store 3-level or more data, and a plurality of the reference memory cells are provided for one selected memory cell so as to correspond to the storage states of 3 levels or more.

* * * * *